United States Patent
Okabe et al.

(10) Patent No.: US 8,302,637 B2
(45) Date of Patent: Nov. 6, 2012

(54) METHOD OF PROCESSING AN OBJECT IN A CONTAINER AND LID OPENING/CLOSING SYSTEM USED IN THE METHOD

(75) Inventors: Tsutomu Okabe, Tokyo (JP); Jun Emoto, Tokyo (JP); Tomoshi Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 987 days.

(21) Appl. No.: 12/174,852

(22) Filed: Jul. 17, 2008

(65) Prior Publication Data
US 2009/0035100 A1 Feb. 5, 2009

(30) Foreign Application Priority Data

Jul. 31, 2007 (JP) ................................. 2007-198622

(51) Int. Cl.
*B65B 1/04* (2006.01)
(52) U.S. Cl. ............. 141/98; 141/63; 414/411; 414/935
(58) Field of Classification Search .................. 141/63, 141/70, 98; 414/217.1, 411, 935; 206/710–712
See application file for complete search history.

(56) References Cited

U.S. PATENT DOCUMENTS

| | | | | |
|---|---|---|---|---|
| 6,795,202 B2 * | 9/2004 | Emoto et al. | .................. | 356/630 |
| 6,817,822 B2 * | 11/2004 | Tokunaga | ..................... | 414/217 |
| 6,984,839 B2 * | 1/2006 | Igarashi et al. | .......... | 250/559.33 |
| 7,621,714 B2 * | 11/2009 | Miyajima et al. | ............. | 414/810 |
| 7,726,353 B2 * | 6/2010 | Okabe | ............................ | 141/63 |
| 7,841,371 B2 * | 11/2010 | Okabe | ............................ | 141/63 |
| 2007/0151619 A1 | 7/2007 | Okabe | | |
| 2007/0151620 A1 | 7/2007 | Okabe | | |
| 2008/0134483 A1 | 6/2008 | Aburatani | | |
| 2009/0169342 A1 * | 7/2009 | Yoshimura et al. | ........... | 414/217 |

FOREIGN PATENT DOCUMENTS

| | | |
|---|---|---|
| EP | 1 780 785 A1 | 5/2007 |
| JP | 11-145245 | 5/1999 |
| JP | 2003-7799 | 1/2003 |
| JP | 2007-180517 | 7/2007 |
| JP | 2008-160076 | 7/2008 |
| WO | WO 2005/124853 A1 | 12/2005 |

OTHER PUBLICATIONS

U.S. Appl. No. 12/773,368, filed May 4, 2010, Okabe.
U.S. Appl. No. 12/844,457, filed Jul. 27, 2010, Okabe, et al.

* cited by examiner

*Primary Examiner* — Gregory Huson
*Assistant Examiner* — Jason K Niesz
(74) *Attorney, Agent, or Firm* — Oblon, Spivak, McClelland, Maier & Neustadt, L.L.P.

(57) ABSTRACT

A partial pressure of oxidizing gas in an opened state FOUP fixed in a FIMS system is reduced when the FOUP is closed. Purge gas supply nozzles are placed outside of two vertical sides of an opening portion (10) within the FIMS. A curtain nozzle is additionally installed which can form a gas curtain from purge gas above the top side of the opening portion (10). When a pod (2) is closed with a lid (4), a door opening/closing mechanism keeps the lid (4) at a given angle with respect to the flowing direction of curtain gas for a given period of time, and hence purge gas supplied to the gas curtain is additionally put into use for the purging of the interior of the pod by the lid 4.

7 Claims, 14 Drawing Sheets

※AFTER COMPLETION OF LOADING OPERATION, GAS PURGE OPERATION CONTINUES WHILE READ AND WAITING STATE

METHOD OF PROCESSING AN OBJECT IN A CONTAINER AND LID OPENING/CLOSING SYSTEM USED IN THE METHOD

BACKGROUND OF THE INVENTION

1. Field of the Invention

The present invention relates to a so-called front-opening interface mechanical standard (FIMS) system used when wafers held in a transfer container which is called a pod are transferred among semiconductor processing apparatuses in a semiconductor manufacture process or the like. To be more specific, the present invention relates to a FIMS system which has a purging mechanism for cleaning an inside of the pod and in which the pod serving as an airtight container for containing the wafers, which is called a front-opening unified pod (FOUP), is placed and the wafers are moved with respect to the pod by opening/closing a lid of the pod, i.e., a lid opening/closing system.

2. Description of the Related Art

Up to now, a semiconductor manufacture process has been conducted in a so-called clean room in which semiconductor wafers are treated with high cleanliness maintained therein. However, in order to cope with an increase in wafer size and reduce a cost required for maintenance of the clean room, a method of maintaining only the inside of a processing apparatus, the pod (wafer container), and a mini-environment for substrate transfer from the pod to the processing apparatus in a highly clean state is employed in recent years.

The pod includes a main body portion having a substantially cube shape and a lid. The main body portion includes a rack capable of holding a plurality of wafers therein in a state where the wafers are separated from one another in parallel and an opening which is provided on a surface of the main body and is used for putting in/taking out wafers. The opening is closed with the lid. A pod in which a forming surface of the opening is located not vertically below the pod but on a side surface of the pod (in front of the mini-environment) is generically called a front-opening unified pod (FOUP). The present invention is mainly intended for a structure using the FOUP.

The above-mentioned mini-environment includes a first opening portion opposed to the opening of the pod, a door for closing the first opening portion, a second opening portion provided on a semiconductor processing apparatus side, and a transfer robot that moves through the first opening portion to the inside of the pod to hold the wafer and passes through the second opening portion to transfer the wafer to the semiconductor processing apparatus side. A structure for forming the mini-environment includes a mount base for supporting the pod so that the opening of the pod is simultaneously opposed to the front surface of the door.

A positioning pin inserted into a positioning hole provided on a lower surface of the pod to regulate a mount position of the pod and a clamp unit engaged with a portion to be clamped which is provided on the lower surface of the pod to fix the pod onto the mount base are located on an upper surface of the mount base. The mount base is normally movable back and forth with respect to a door direction by a predetermined distance. When the wafers in the pod are to be transferred to the processing apparatus, the pod is moved in a state where the pod is mounted until the lid of the pod comes in contact with the door. After that contact, the lid is removed from the opening portion of the pod by the door. With the operations described above, the inside of the pod is connected to the inside of the processing apparatus through the mini-environment. Subsequently, wafer transfer operation is repeated. A system including the mount base, the door, the opening portion, a door opening/closing mechanism, a wall which is a part of the mini-environment including the opening portion, and the like is generally called a front-opening interface mechanical standard (FIMS) system.

In ordinary cases, the inside of the pod with a wafer or the like loaded therein is filled with dry nitrogen or the like which is controlled to be highly clean to prevent the entry of contaminants, oxidizing gas, and the like into the pod. However, when a wafer in the pod is introduced into various kinds of processing apparatus to be subjected to predetermined processing, the inside of the pod and the inside of the processing apparatus are always kept communicating with each other. A fan and a filter are located above a chamber where the transfer robot is located such that clean air with managed particles and the like is introduced into the chamber. However, when such the air enters the pod, there is a fear that the surface of the wafer may be oxidized by oxygen or moisture in the air.

As semiconductor devices get smaller and achieve higher performance, more attention is being paid to oxidation due to oxygen and the like that enter the pod, which has conventionally not been such a big problem. Such oxidizing gas forms a very thin oxide film on the surface of the wafer or on various kinds of layers formed on the wafer. There is a possibility that, due to such the oxide film, desired characteristics of the minute devices can not be secured. Measures against this include control of the entry of gas without the partial pressure of oxygen and the like therein being controlled from the outside of the pod into the pod. To be more specific, Japanese Patent Application Laid-Open No. 11-145245 discloses a structure in which a region in a FIMS system adjacent to a pod opening is provided with a supply nozzle and a suction nozzle for gas to form an airflow curtain for substantially closing the pod opening portion. By forming the airflow curtain, the entry of external gas into the pod is prevented.

In semiconductor manufacturing equipment, there are some cases where a process using gas which contaminates various kinds of wiring and the like formed on the wafer such as an etching process is conducted in processing apparatus. A method of controlling the entry of the gas from the inside of the processing apparatus into the pod in this case is disclosed in Japanese Patent Application Laid-Open No. 2003-007799. This method also forms an airflow curtain in front of a pod opening in a FIMS system using a fan to prevent the entry of the gas from the processing apparatus into the pod. This method is considered to be effective also in controlling inflow of oxygen into the pod as a matter of course.

However, when those methods were put to practical use, it was actually confirmed that, immediately after the pod opening was opened, the partial pressure of oxygen in the pod remarkably increased. Therefore, in order to meet the above-mentioned requirement, it is necessary to further improve those methods. In light of these circumstances, the inventors of the present invention have proposed a structure of preventing oxidizing gas from infiltrating into the pod by modifying the shape and the like of a gas discharge nozzle that is used to create an airflow curtain in various ways so that the oxygen concentration in the airflow curtain is reduced in a place apart from the nozzle as well. The inventors of the present invention have also proposed a structure in which the oxidizing gas in the pod is reduced even more by introducing purge gas into the pod while forming an airflow curtain. However, further lowering of the partial pressure of oxidizing gas in a pod fixed to a FIMS system is needed because of various demands for higher semiconductor performance and improved processing ability of a semiconductor manufacturing apparatus.

SUMMARY OF THE INVENTION

The present invention is made in view of the above-mentioned situation, and an object of the present invention is to provide a method of processing wafers, and a lid opening/closing system of a pod as an airtight container used for the method thereof, which makes it possible to control the partial pressure of oxidizing gas such as oxygen in the pod at a predetermined low level even after the pod is opened.

In order to solve the above-mentioned problem, according to the present invention, there is provided a method of processing an object in a container, the container being a storage container which has a substantially box-like main body and a lid, the main body being capable of containing an object inside and having an opening in one face, the lid being detachable from the main body and closing the opening to create an airtight space together with the main body, the object to be contained being put in and taken out of the storage container by detaching the lid from the storage container and thus opening the opening, the object to be contained receiving given processing outside the storage container, the method including: placing the opening directly opposite from a substantially rectangular opening portion, which is provided in a wall constituting a mini-environment where particles are controlled; holding the lid with a door, which substantially closes the opening portion; pivoting the door holding the lid by a given angle about a horizontal axis, which is below the opening portion and parallel to the wall, to move the lid into the mini-environment and put the door in an evacuation posture, and driving the door kept in the evacuation posture vertically downward to open the opening portion; putting in and taking out the object to be contained through the opening and the opening portion; driving the door in the evacuation posture vertically upward to return the door to a stop position where the door has been in after pivoting by the given angle, and then pivoting the door by the given angle in a reverse direction to close the opening with the lid; and releasing the lid from the hold of the door. A gas curtain can be formed by given gas flowing from a top side to bottom side of the opening portion. The method further includes purging an interior of the storage container by bringing the gas curtain into contact with the lid held by the door while the door is maintaining the evacuation posture after stopping pivoting, thereby redirecting the flow of the given gas forming the gas curtain toward the interior of the storage container.

Further, in order to solve the above-mentioned problem, according to the present invention, there is provided a lid opening/closing system for putting an object to be contained in a storage container and taking the object out of the storage container, the storage container having a substantially box-like main body and a lid, the main body being capable of containing an object inside and having an opening in one face, the lid being detachable from the main body and closing the opening to create an airtight space together with the main body, the object to be contained being put in and taken out of the storage container by detaching the lid from the storage container and thus opening the opening, the system including: a mount base to which the storage container is mounted; a mini-environment which is placed adjacent to the mount base, in which downflows with controlled particles are created through a fan filter unit placed above, and which houses a mechanism for transferring the object to be contained; a substantially rectangular opening portion provided in a wall, which is adjacent to the mount base and which defines a part of the mini-environment, and placed directly opposite from the opening in the storage container when the storage container is mounted to the mount base; a door which is capable of holding the lid and substantially closing the opening portion, and which opens the opening portion by holding the lid so that the opening and the opening portion communicate with each other; purge nozzles placed in the mini-environment and outside two vertical sides of the opening portion to supply given gas into the storage container through the opening portion and the opening; and an influx preventing member placed in the mini-environment immediately in front of the opening portion and above a top side of the opening portion, to prevent the downflows from flowing into a space immediately in front of the opening portion. The influx preventing member includes a curtain nozzle capable of supplying the given gas in a direction parallel to a direction of the downflows flowing from the top side of the opening portion toward a bottom side of the opening portion. When the opening is to be opened, the door holding the lid pivots by a given angle about a horizontal axis, which is below the opening portion and parallel to the wall, to move the lid into the mini-environment. The influx preventing member covers a rectangular area, which is formed when the door pivots by the given angle and whose opposite two sides are a top side of the lid and the wall, with respect to the flowing direction of the downflows, and the given gas from the curtain nozzle is supplied toward the rectangular area.

According to the present invention, a gas curtain is formed by a flow of inert gas in a place which is adjacent to an opening of a pod and where the opening is closed by the gas curtain, and is used as an additional path for supplying purge gas into the pod when the interior of the pod is purged. Whereas the purge operation in prior art is conducted only through a gas supply path that is originally intended for purge gas, the purge operation in the present invention can be conducted through the additional path, which speeds up the purge operation or improves the purge efficiency.

In addition, the concentration of inert gas in the inert gas flow which forms the gas curtain itself can be maintained at a high level. For example, it is known that, when gas is ejected from a nozzle, the gas involves other gas existing close to a nozzle opening and the gas mixture forms gas flow. To be more specific, because the gas forming the gas curtain involves other gas existing close to the nozzle, the concentration of inert gas forming the gas curtain decreases, and there is a fear that oxidizing gas is supplied from the gas curtain to the inside of the pod. Also, the concentration of inert gas forming the gas curtain could be lowered by surrounding gas pulled into the gas curtain. According to the present invention, a curtain cover separates the downflows constituting the surrounding gas from the curtain nozzle, or a space around the curtain nozzle, and hence a high concentration of inert gas constitutes gas in the vicinity of a nozzle opening portion as well. The curtain cover also prevents the downflows from entering an area between the wall and the lid when the flow of the gas curtain is redirected toward the interior of the pod upon contact with the lid. The present invention thus prevents the entrance or diffusion of the downflows or other gas containing oxidizing gas beyond the gas curtain which leads to this area. As a result, the infiltration of oxidizing gas into the pod can be prevented effectively.

Forming the gas curtain also reduces the diffusion of surrounding gas into the pod. The supply of inert gas to an inside of the pod is carried out in a predetermined direction so as not to affect the gas curtain. To be more specific, the gas curtain controls the entry of gas from the outside of the pod into the inside of the pod, and, at the same time, inert gas is supplied to the inside of the pod, to maintain the concentration of inert gas in the pod at a constant level. By combining those effects, even when the pod is open, the partial pressure of oxidizing gas in the pod is always maintained at a predetermined low level. Further, by combining those effects, compared with a case where the entry of oxidizing gas into the inside of a pod is prevented by simply supplying inert gas to the inside of the pod and thus a large amount of inert gas is necessary, comparable or better effect of maintaining the partial pressure of oxidizing gas at a low level can be obtained with an extremely small amount of inert gas.

Further features of the present invention will become apparent from the following description of exemplary embodiments (with reference to the attached drawings).

DESCRIPTION OF THE EMBODIMENTS

Figure 1:
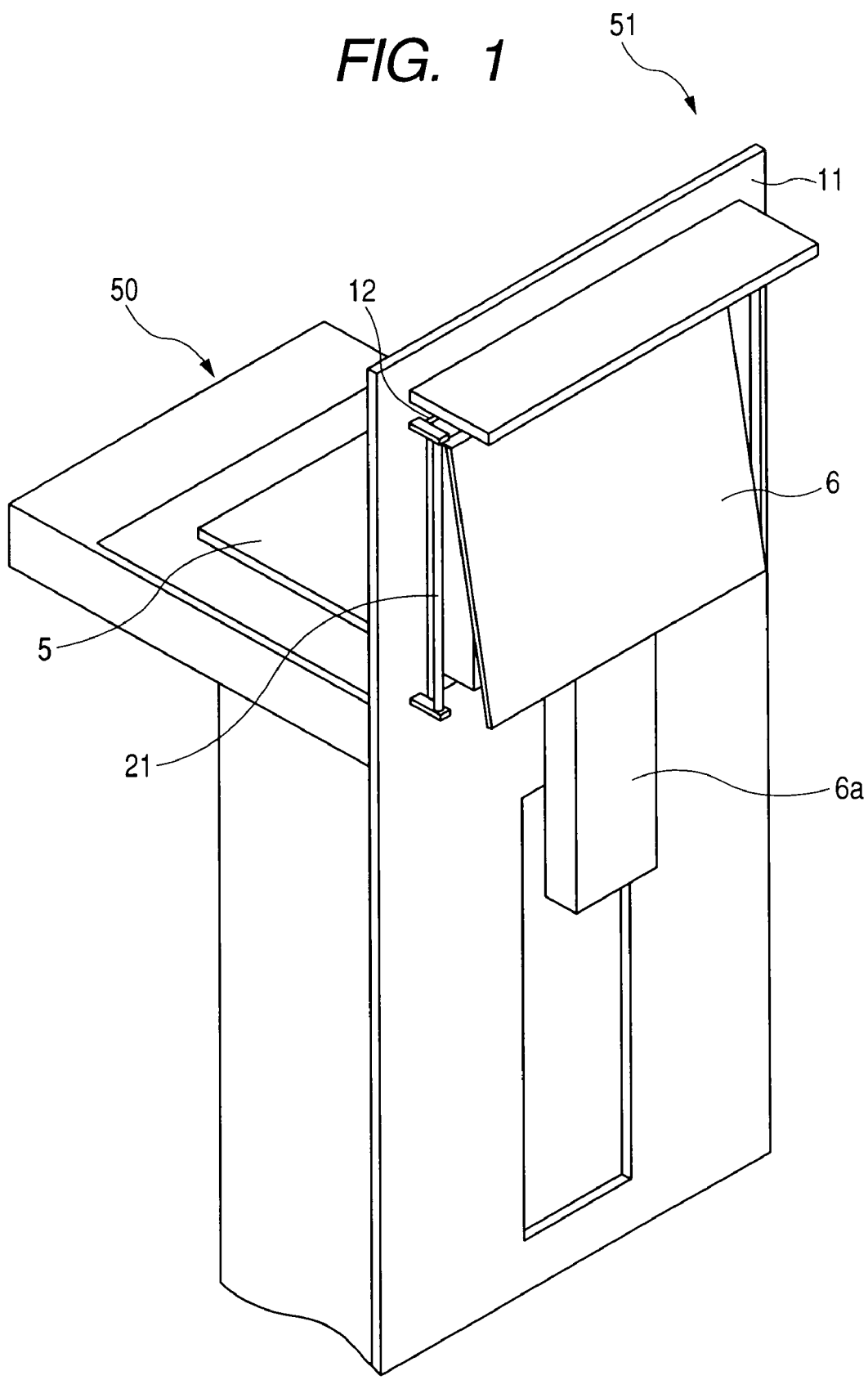
FIG. 1 is a perspective view illustrating the schematic structure of a main part of a lid opening/closing system according to an embodiment of the present invention.
Figure 2A:
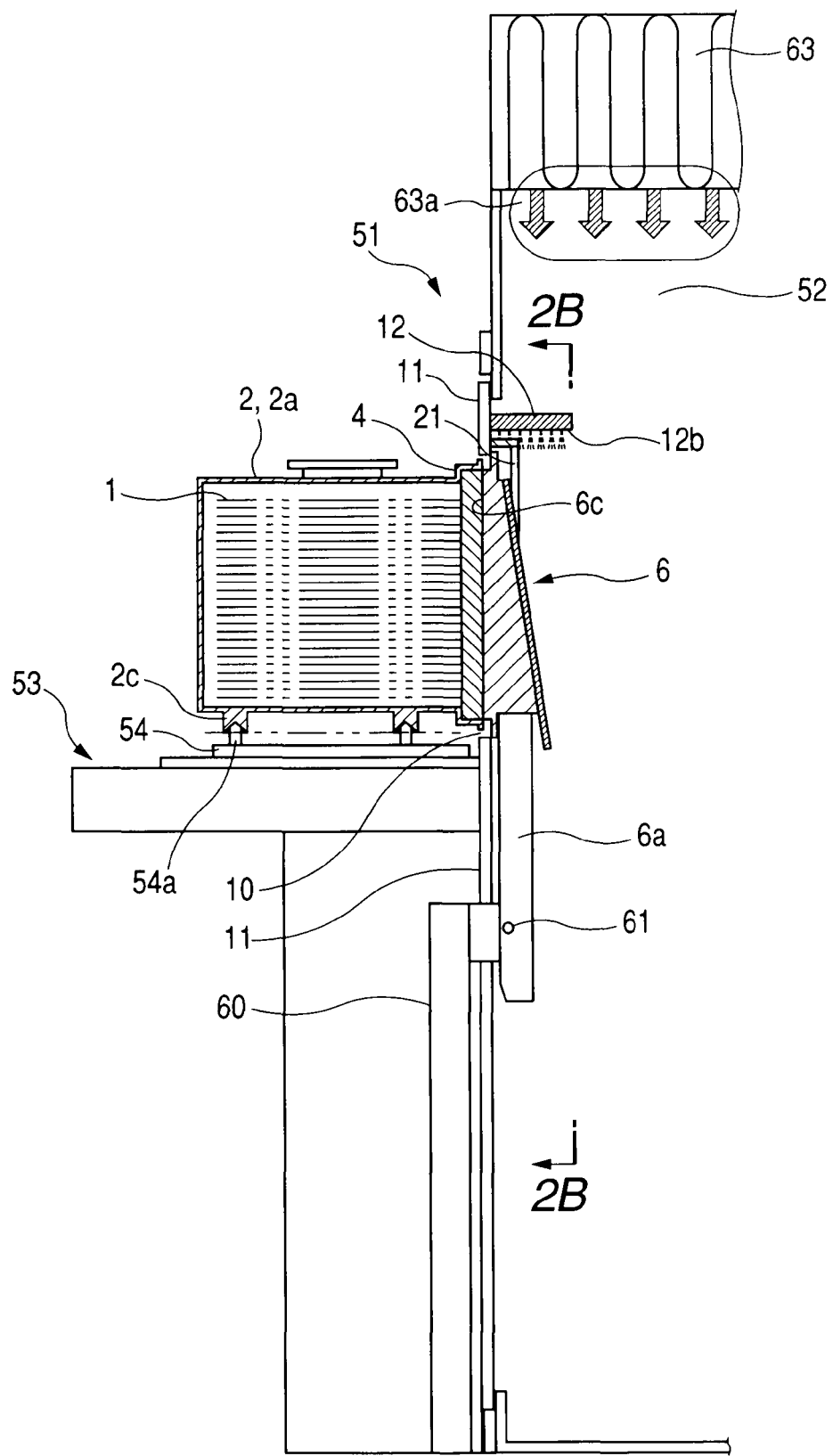
FIG. 2A is a diagram illustrating in section the schematic structure of the lid opening/closing system according to the embodiment of the present invention as illustrated in FIG. 1, specifically, a vertical sectional view of a load port, a pod, a lid of the pod, and a part of an opener viewed perpendicularly to an opening of the pod.
Figure 2B:
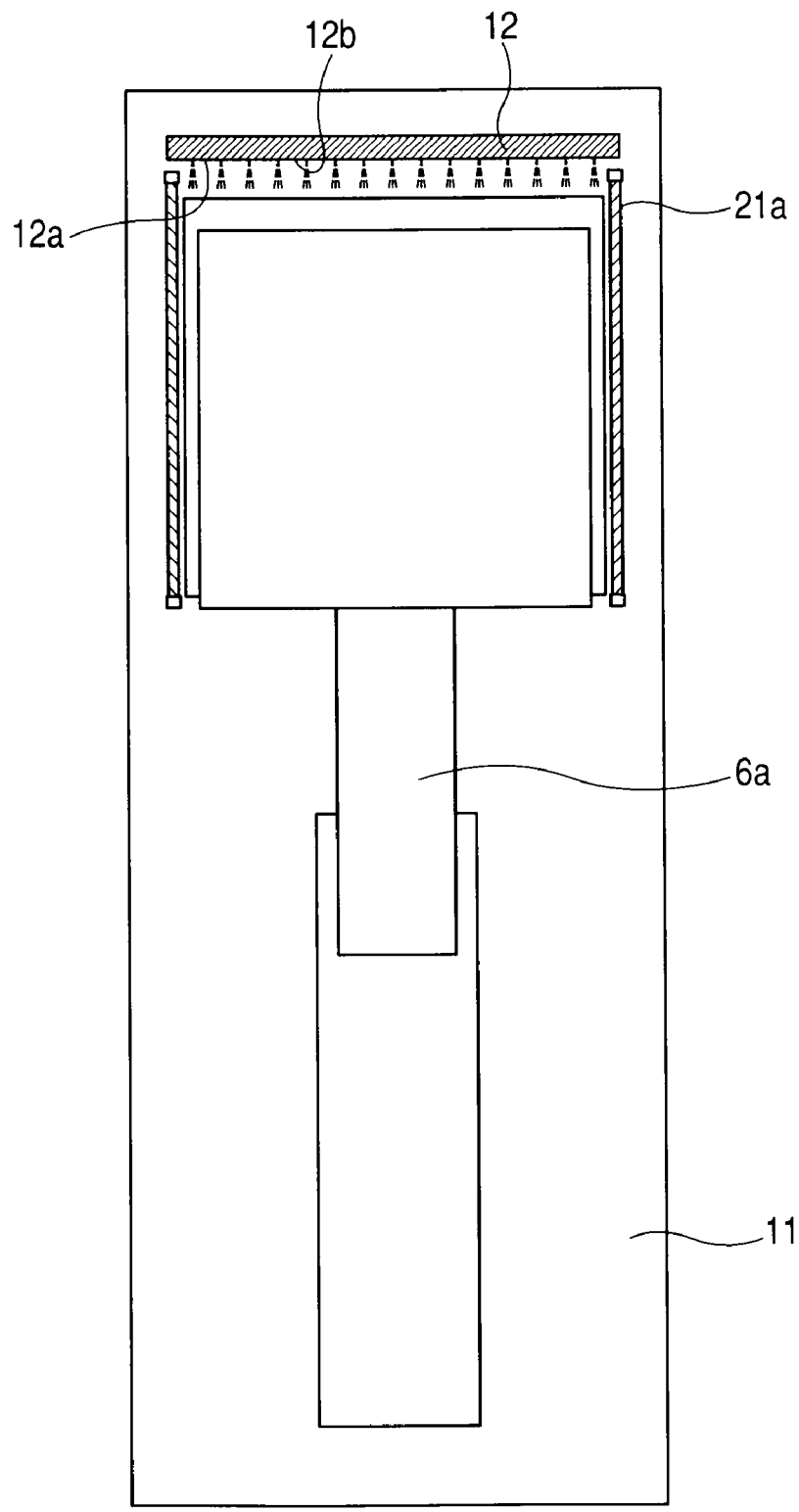
FIG. 2B is a diagram of an opening portion 10 of FIG. 1 viewed from a direction that is indicated by an arrow 2B in FIG. 2A.

Embodiments of the present invention will be described below with reference to the accompanying drawings. FIG. 1 illustrates the schematic structure of an important part of a lid opening/closing system (FIMS, hereinafter referred to as load port) according to a first embodiment of the present invention. FIG. 1 is a schematic perspective view viewed from the mini-environment side, and illustrates only the mount base, the door, the opening portion, a part of the door opening/closing mechanism, and the wall having the opening portion and constituting a part of the mini-environment, which have been described above, and an influx preventing member and subsidiary components, which are newly added in the present invention. FIG. 2A is a diagram illustrating in section the schematic structure of the load port and a pod with the pod mounted to the load port (mount base) and a lid of the pod abutted against the door. FIG. 2B is a sectional view taken along the line 2B-2B of FIG. 2A and from the mini-environment side. The mount base and other components have various subsidiary components, which are not related directly to the present invention and accordingly will not be illustrated nor described herein.

The pod mounted to the load port and a wafer contained in the pod will be described first (see FIG. 2A). The interior of a main body 2a of a pod 2 is a space for containing a wafer 1, which is an object to be processed. The main body 2a has an approximate box shape having an opening provided in one of surfaces located in a horizontal direction thereof. The pod 2 includes a lid 4 for enclosing the opening 2b of the main body 2a. The main body 2a includes therein a rack (not shown) having a plurality of shelves for stacking the wafers 1 which are horizontally held in a vertical direction. Each of the wafers 1 placed on the shelves is stored in the inside of the pod 2 at predetermined intervals. The wafer 1 corresponds to the object to be contained of the present invention, and the pod 2 to the storage container. The main body 2a, which is shaped basically like a box, corresponds to the main body, which is defined as a substantially box-like shape. The opening 2b of the pod 2, which has a basically rectangular shape, corresponds to the opening, which is defined as a substantially rectangular shape.

A load port according to the present invention is denoted by 51, and includes a mount base 53, a door 6, an opening portion 10, which functions as an opening portion of the load port, a door opening/closing mechanism 60, and a wall 11, which has the opening portion and which is one of members constituting a mini-environment (a transfer chamber 52 described later). The mount base 53 includes a movable plate 54 with a flat top face on which the pod 2 is actually mounted. The movable plate 54 is capable of moving the mounted pod closer to or away from the opening portion 10. A positioning pin 54a is buried in the flat face of the movable plate 54, and is fit in a positioning concave portion 2c provided in the bottom face of the pod main body 2a, thereby uniquely determining a positional relation between the pod 2 and the movable plate 54.

The opening portion 10 provided in the wall 11 is sized such that, when the pod 2 positioned on the movable plate 54 is brought by the plate to a point closest to the opening portion 10, the lid 4 covering the pod opening 2b fits in the opening portion 10. In other words, the opening portion 10 is a rectangle one size larger than the rectangular outline of the lid 4. The movable plate 54 may bring the pod 2 to a stop at any place as long as the door 6 can detach the lid 4 of the pod 2 from the pod main body 2a. The door 6 is supported by the door opening/closing mechanism 60 via a door arm 6a. The door opening/closing mechanism 60 enables the door 6 to move between a position where the opening portion 10 is substantially closed and an evacuation position where the opening portion 10 is opened completely so that a not-shown transfer mechanism can put the wafer 1 in the pod 2 and take the wafer 1 out of the pod 2 through the opening portion 10.

The door opening/closing mechanism 60 is constructed from not-shown components such as a plurality of air cylinders, and pivots the door 6 about a fulcrum 61 together with the door arm 6a. The door 6 pivots between the position where the opening portion 10 is closed and a position where the door 6 takes an evacuation posture before driven to the vertically lower evacuation position. With the door 6 in the evacuation posture, the distance between a face 6c of the door 6 which faces the opening portion 10 and the planar face (wall 11) in which the opening portion 10 is opened decreases continuously from the top side toward the bottom side of the opening portion 10. In other words, the opposing face 6c of the door 6 in the evacuation posture which faces the opening portion 10 is placed at a given elevation angle with respect to a plane that contains the wall 11. Placing the opposing face 6c of the door 6 in the evacuation posture far from the bottom side of the opening portion 10 is not desirable in view of pod interior purging, which will be described later. In the present invention, while the door 6 in the evacuation posture is holding the lid 4, a gap between the bottom side of the opening portion 10 and a face of the lid 4 that faces the interior of the pod is kept at a distance that prevents the lid 4 from interfering the flow of purge gas, which is supplied to the pod interior from a purge nozzle as will be described later, with the thickness of the lid 4 taken into consideration.

A curtain nozzle 12 is placed in an upper part of a space immediately in front of the opening portion 10 (above the top side of a first opening). The curtain nozzle 12 is installed in order to form a gas curtain by downflows immediately in front of the opening portion 10 in the mini-environment 52. The curtain nozzle 12 in this embodiment is shaped like a rectangular parallelepiped, and has a bottom face 12a which faces the space immediately in front of the opening portion 10 and in which a plurality of nozzle openings 12b are formed. In an area of the mini-environment 52 that is outside the two vertical sides of the opening portion 10, purge nozzles 21 are placed in order to supply the purge gas to purge the interior of the pod 2. Each purge nozzle 21 has a tubular purge nozzle main body 21a extending in one direction, and is connected to a not-shown purge gas supply system. The purge nozzle main body 21a forms a pair with another purge nozzle main body 21a to run adjacent to and in parallel to the two vertical sides of the load port opening portion 10 outside the vertical sides of the opening portion.

Figure 3:
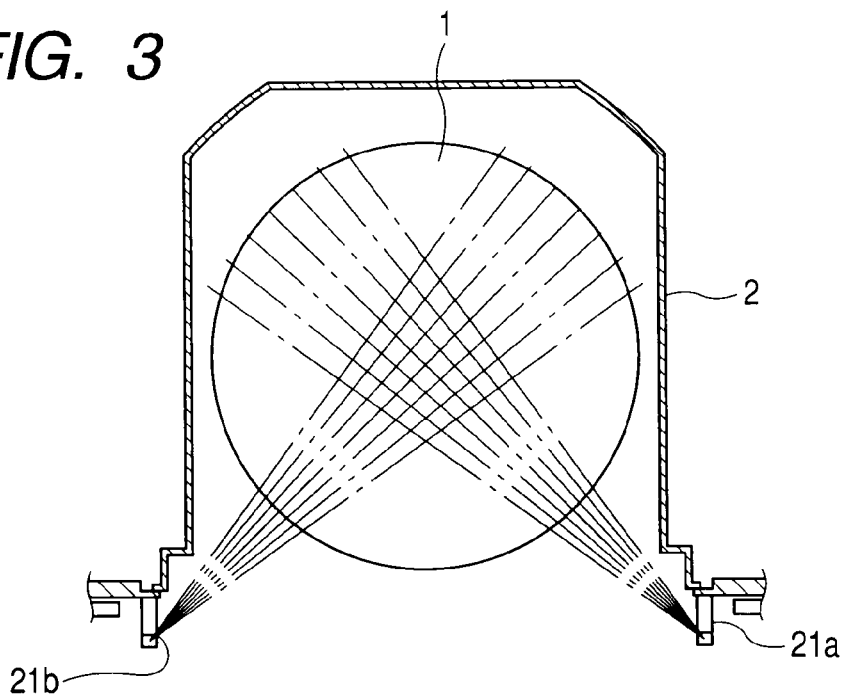
FIG. 3 is a diagram illustrating a supply direction of purge gas, which is supplied from a purge nozzle to the interior of the pod.

FIG. 3 illustrates the schematic structure of the purge nozzle main bodies 21a, the pod 2, and the wafer 1 viewed from above. Desirably, a plurality of purge nozzle openings 21b are formed at regular intervals along the length of each purge nozzle main body 21a, and the intervals between the purge nozzle openings 21b match intervals at which the wafers 1 are contained in the pod 2 and the distance between one wafer 1 and another. The purge nozzle openings 21b are also formed such that gas is discharged toward the center of each wafer 1. In other words, a direction in which gas is supplied from the purge nozzle is desirably a direction that is in parallel to a plane perpendicular to the gas supply direction of the curtain nozzle and that is directed toward a point equidistant from the two purge nozzles within this plane.

Setting the purge gas supply direction perpendicular to the direction in which the curtain gas flows ensures that the purge gas is supplied to the interior of the pod 2. Whereas the most effective way under normal conditions is to eject the purge gas such that the purge gas travels to the wafer surface, here the purge gas is supplied in parallel to the wafer surface from reasons including the narrow gap between the wafers 1 in the pod 2. The purge nozzles 21 and the above-mentioned curtain nozzle 12 are, in practice, connected to a not-shown gas supply system, which is omitted from the drawings in order to make the structure of the present invention easier to understand. Also, a description on the gas supply system, which is a common model built from a gas source, a regulator, and others, is omitted herein.

Described next is how this structure operates when the wafer 1 is actually put in and taken out of the pod 2. At the time the pod 2 is mounted to the mount base 53, the opening portion 10 is substantially closed by the door 6. The door 6 in this embodiment is sized such that, when the door 6 is in the position where the opening portion 10 is closed, a clearance for communicating the mini-environment 52 with an external space is left around the door 6. Accordingly, the door 6 in this embodiment can close the opening portion 10 only substantially and not completely. After the pod 2 is mounted, the movable plate 54 moves toward the opening portion 10 and stops at a point where the lid 4 is abutted against the door 6. The door 6 holds the lid 4 with a not-shown engaging mechanism. A fan filter unit 63 keeps creating downflows in the mini-environment 52, and a gas curtain immediately in front of the opening portion 10 is kept formed from gas supplied from the curtain nozzle 12 from before the pod 2 is mounted.

Figure 4A:
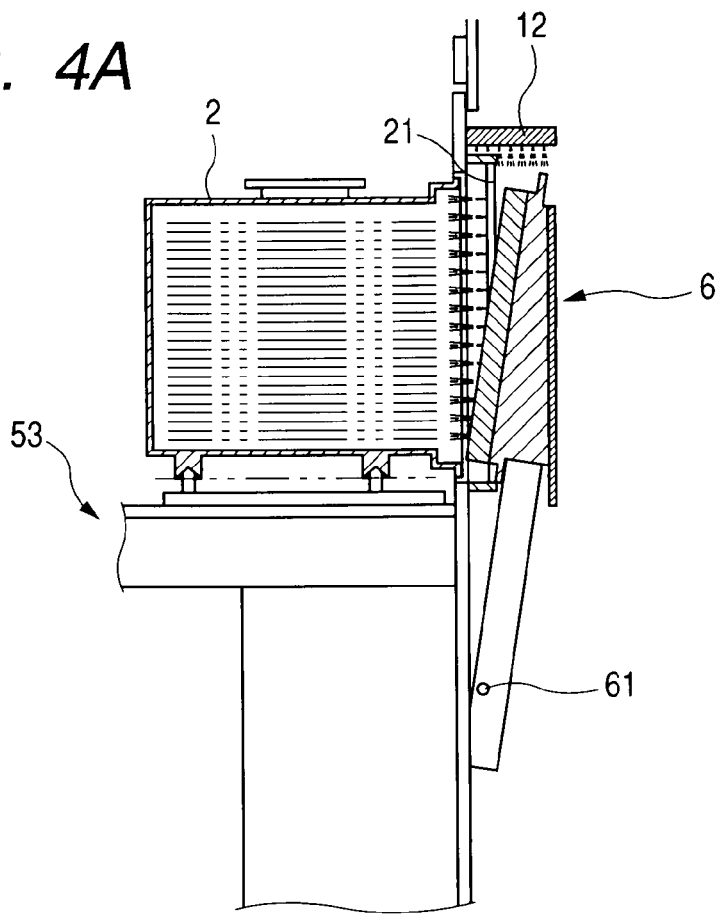
FIG. 4A is a diagram illustrating a stage of a lid opening/closing operation in the lid opening/closing system of FIG. 1.
Figure 4B:
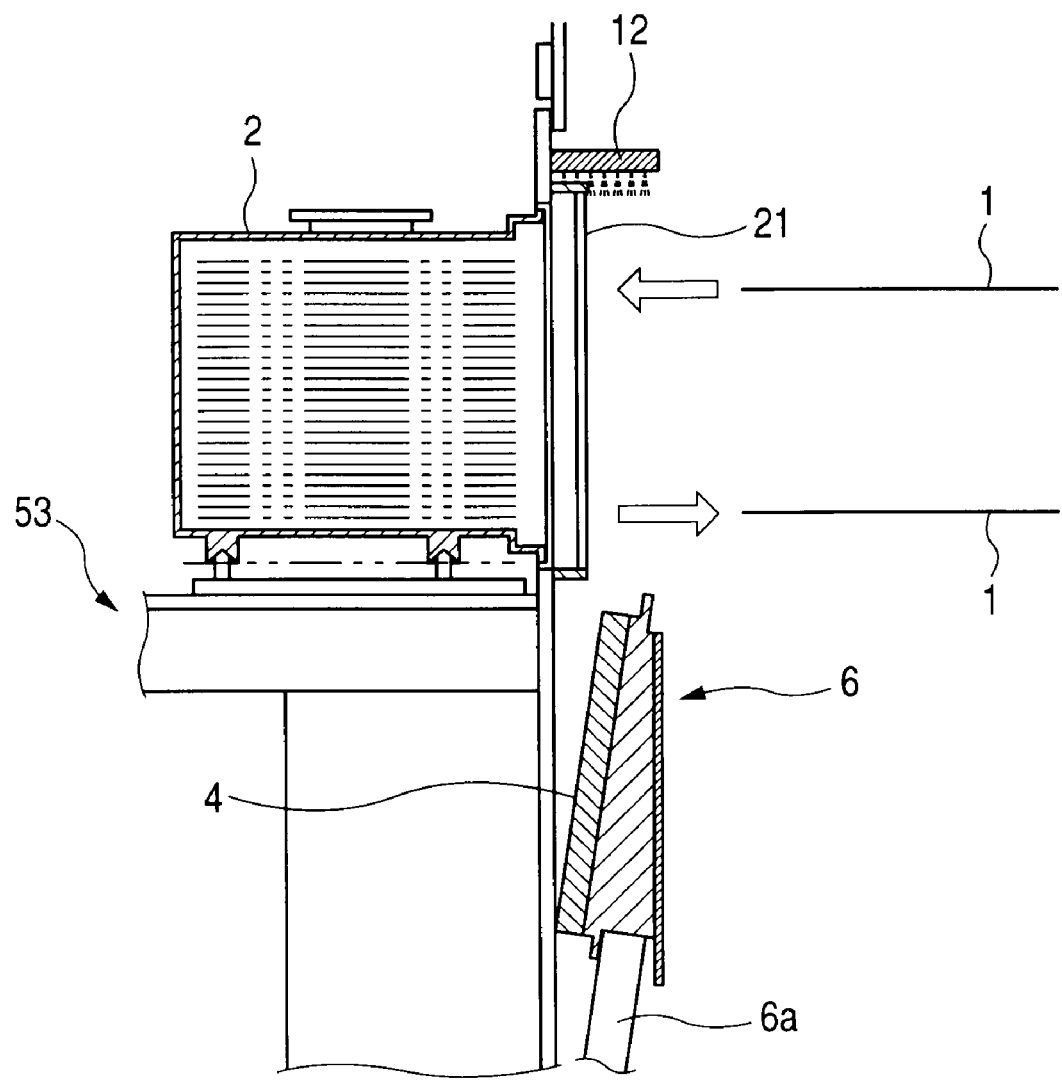
FIG. 4B is a diagram illustrating another stage of the lid opening/closing operation in the lid opening/closing system of FIG. 1.

The door opening/closing mechanism 60 then pivots the door arm 6a about the fulcrum 61 so that the door 6 takes the evacuation posture illustrated in FIG. 4A, thereby partially opening the pod 2 to the mini-environment 52. FIG. 4A and FIG. 4B, which will be described later, are side views of the surroundings of the opening portion 10 which are viewed in the same manner as in FIG. 2A. As described above, the lower end of the lid 4 held by the door 6 in the evacuation posture substantially closes the opening portion 10 whereas the upper end of the lid 4 is kept at a given distance from the opening portion 10. The clearance that is formed by the lid 4 moving away from the opening portion 10 and opened upward stays within a range covered by the nozzle openings 12b of the curtain nozzle 12. At this point, the purge nozzles 21 start supplying the purge gas. The door opening/closing mechanism 60 makes the door 6 retreat to the evacuation position, which is the lowermost end of the drive range of the door 6, while keeping the door 6 in the evacuation posture. FIG. 4B illustrates the door 6 at the evacuation position. With the door 6 at the evacuation position, the opening 2b of the pod 2 is opened, thereby enabling the not-shown transfer mechanism installed in the mini-environment 52 to transfer the wafer 1 to and from the interior of the pod 2.

Figure 4C:
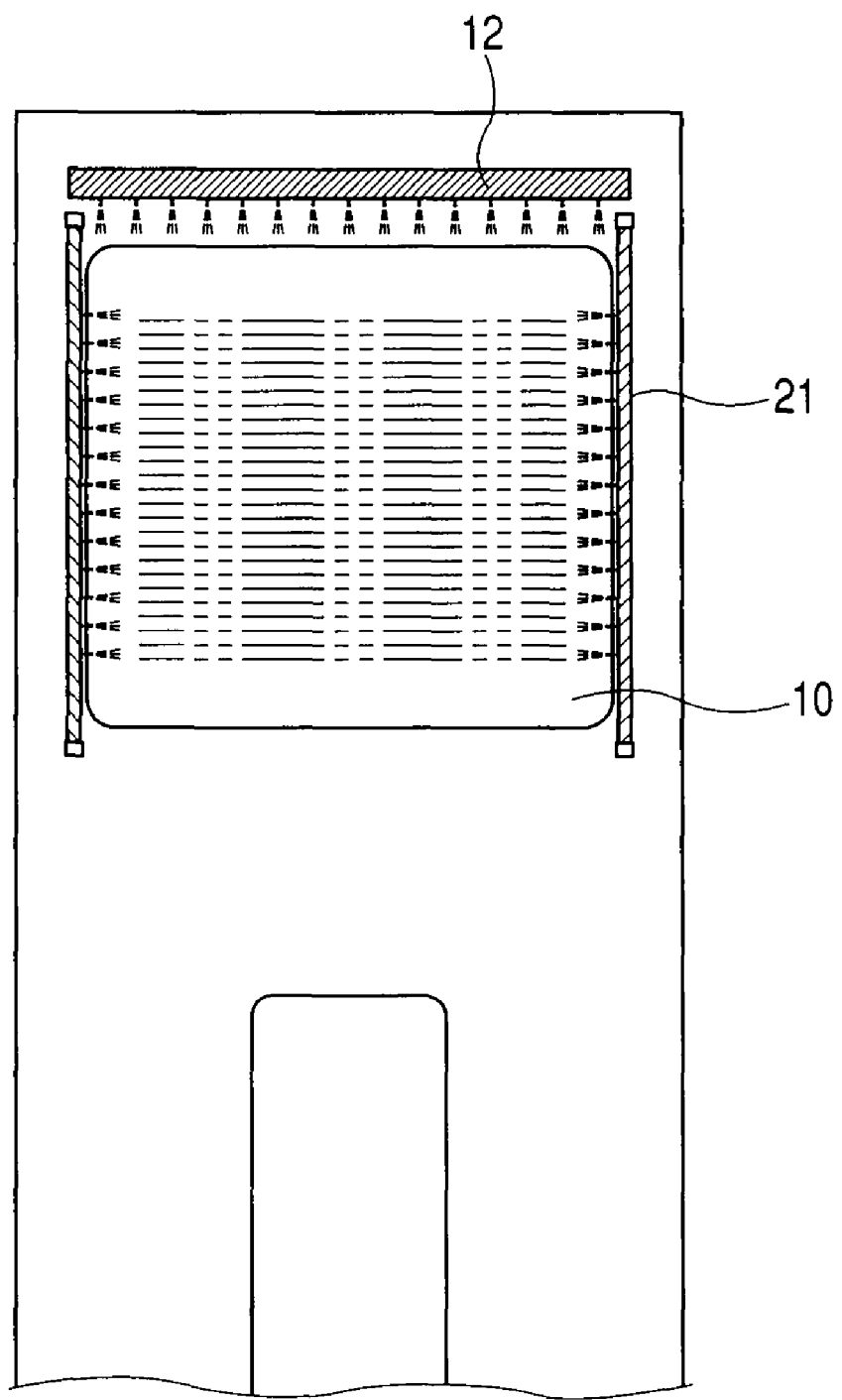
FIG. 4C is a diagram of the opening portion 10 in a state of FIG. 4B viewed in the same direction as in FIG. 2B.

FIG. 4C is a schematic structural diagram of the opening portion 10 viewed from the mini-environment 52 in the same manner as in FIG. 2B. The curtain nozzle 12 supplies the same gas as the purge gas in a manner that creates downflows parallel to the wall 11. The paired purge nozzles 21 each supply the purge gas such that each flow of the purge gas is directed toward the center of the wafer 1 contained in the pod 2. The wafer 1 is transferred in this state. During the wafer transfer operation, the purging of the interior of the pod 2 is continued to keep the partial pressure of oxidizing gas within the pod low. After the wafer 1 to be contained is transferred into the pod 2, the following operation of closing the lid 4 is executed.

In the lid closing operation, the door opening/closing mechanism 60 elevates the door 6 to return the door 6 to the position where the door 6 has stopped pivoting and taken the evacuation posture illustrated in FIG. 4A. The door opening/closing mechanism 60 suspends its operation in this state, and keeps the door 6 in a posture that the door 6 has been in prior to the pivoting. This puts the lid 4 held by the door 6 at an angle with respect to the gas curtain, and changes the direction of the gas flow from downward to a direction toward the interior of the pod. Then, most of the curtain gas supplied to the clearing above the upper end portion of the lid 4 is sent toward the interior of the pod 2 because only the lower end portion of the lid 4 substantially closes the opening portion 10 when the door 6 is in the evacuation posture as described above.

This increases the total amount of purge gas supplied toward the pod interior immediately before the pod is closed by the lid much more than the total amount of purge gas supplied from normal purge nozzles alone. The state illustrated in FIG. 4A is maintained for a given period of time, and after the interior of the pod 2 is purged enough to reduce the amount of oxidizing gas present in this space satisfactorily, the door opening/closing mechanism 60 pivots the door 6 and closes the pod opening portion 2a with the lid 4. Through the above operation, the wafer 1 can be sealed in the pod 2 at an oxidizing gas concentration lower than ever achieved by conventional structures.

In the operation described above, the door 6 stays in the evacuation position during the operation of putting in and taking out wafers, since when the first wafer is taken out of the pod 2 until when the last wafer is put in the pod 2. However, in the case where purge gas supplied from the purge nozzles is used alone, keeping the pod 2 opened for a long period of time, the partial pressure of oxidizing gas in the pod 2 may increase gradually due to the diffusion of atmospheric air from the mini-environment 52. In such cases, the improved purge efficiency is maintained by elevating the door 6 from the evacuation position to reach the state illustrated in FIG. 4A each time one wafer 1 is put in and taken out of the pod 2. Alternatively, it is desirable to add an operation of closing the pod once after the state of FIG. 4A is reached. The partial pressure of oxidizing gas is thus prevented more effectively from rising.

Figure 5A:
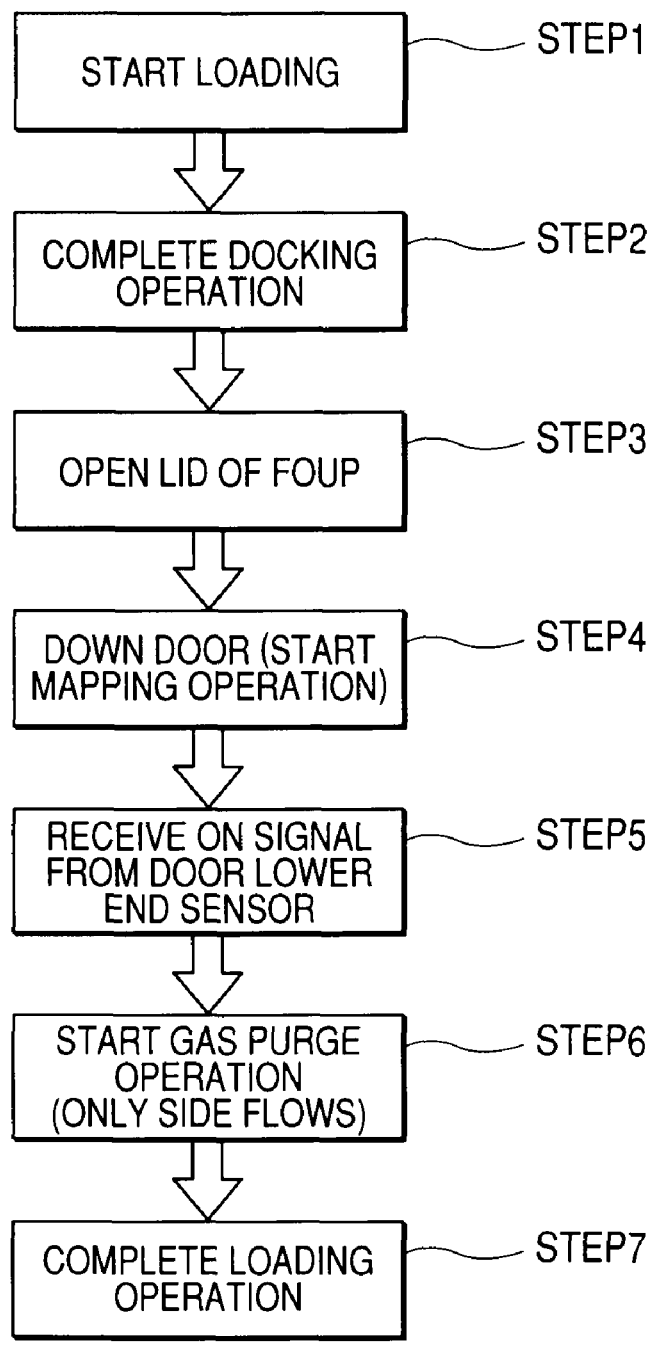
FIG. 5A is a flow chart illustrating operation steps of loading the pod into the lid opening/closing system according to the present invention.
Figure 5B:
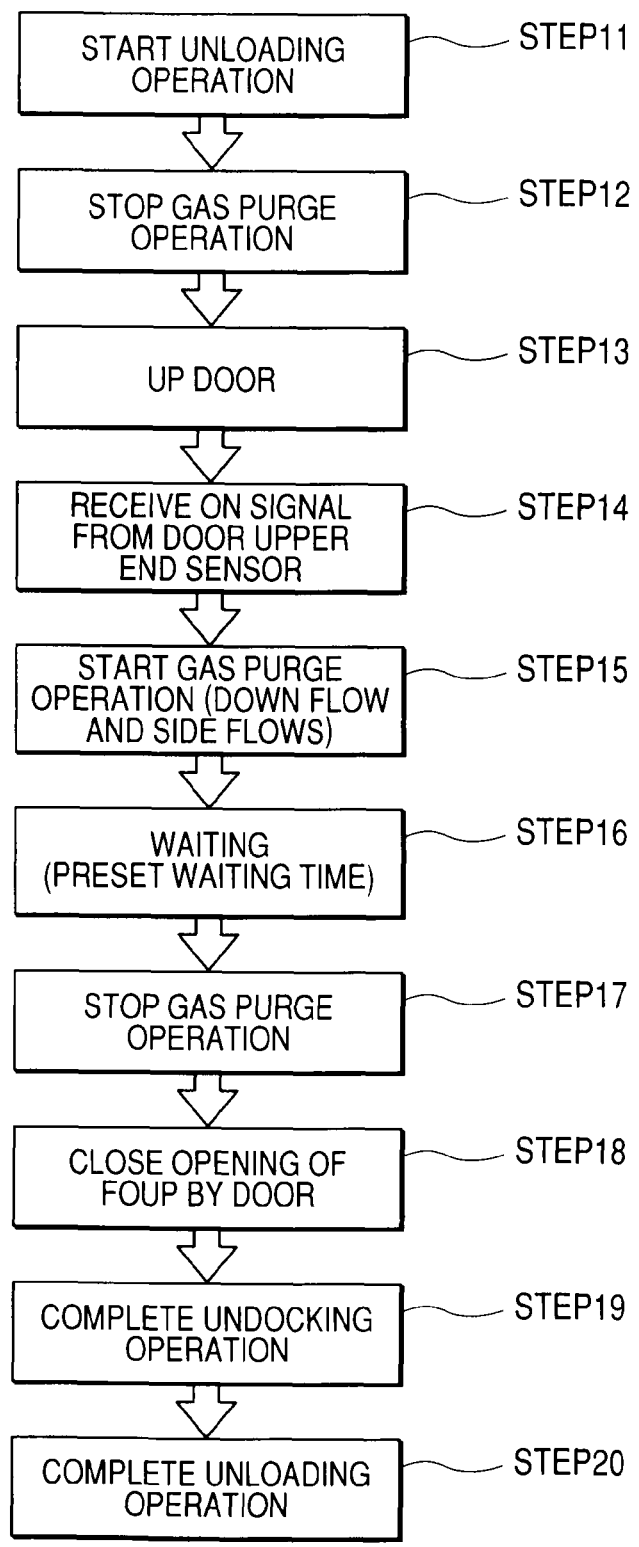
FIG. 5B is a flow chart illustrating operation steps of unloading the pod from the lid opening/closing system according to the present invention.

In the embodiment described above, the gas curtain is kept formed for effective reduction of the partial pressure of oxidizing gas within the pod. To reduce the cost by keeping the amount of purge gas used low, on the other hand, it is desirable to form the gas curtain only when necessary. In an extreme case, it is sufficient if the partial pressure of oxidizing gas in the pod is lowered upon closing of the pod when wafers are put in and taken out of the pod. A purging method in this case is described below. FIG. 5A is a flow chart illustrating an operation from when the lid 4 is detached from the pod 2 until when putting in and taking out the wafers 1 is started. FIG. 5B is a flow chart illustrating an operation of attaching the lid 4 to the pod 2 after putting in and taking out the wafers 1 is completed.

The mounting of the pod 2 is executed in Step 1, engaging the lid 4 with the door 6 by the movement of the movable plate 54 in Step 2, detaching the lid 4 from the pod 2 in Step 3, and taking the door 6 the evacuation posture and then moves to the evacuation position in Step 4. A not-shown mapping mechanism maps wafers in the pod 2 at the same time executing the Step 4. In Step 5, a not-shown sensor at the lower end of the door 6 detects that the door 6 has stopped at the evacuation position. In Step 6, the purge nozzles 21 start supplying the purge gas in response to the detection result. When the above series of operations is finished, it is recognized that an operation of loading the pod 2 is completed, and the operation of taking the wafers 1 out of the pod 2 and putting the wafers 1 in the pod 2 is executed. The purge gas supply started in Step 6 is continued throughout the operation of putting in and taking out the wafers 1.

FIG. 5B illustrates an operation of unloading the pod 2. First, in Step 11, the operation of putting in and taking out the wafers 1 is finished and an instruction to start the unloading operation is issued. In this embodiment, the purge gas supply is temporarily suspended in Step 12 in order to avoid dust such as particles which are caused when purge gas blows against a moving component such as the door 6. The door 6 is then elevated in Step 13 and, in Step 14, the arrival of the door 6 at the upper end of the elevation range (the position where the door 6 has taken the evacuation posture after the pivoting) is detected. In Step 15, the purge nozzles 21 start supplying purge gas and the curtain nozzle 12 starts supplying curtain gas simultaneously in response to the detection result. The flow of the curtain gas changes directions upon contact with the lid 4 and travels toward the interior of the pod 2, and hence the purge gas and the curtain gas both are supplied to the interior of the pod.

This state is maintained until the elapse of a given period of time is detected in Step 16. After the given period of time elapses, the purge gas supply and the curtain gas supply are stopped in Step 17, and the door 6 attaches the lid 4 to the pod 2 in a subsequent Step 18. After the lid 4 is fixed to the pod main body 2a, the movable plate 54 moves backward in Step 19 and, in Step 20, the end of the unloading operation of the pod 2 is confirmed. In the unloading operation described above, the curtain gas (the same gas as the purge gas) from the curtain nozzle is additionally supplied immediately before the lid is closed, to a structure in which originally the purge gas supplied from the purge nozzle is used alone for the purging. A large amount of purge gas can thus be supplied in a short time, which has not been possible with conventional structures. As a result, the pod can be closed off while effectively reducing the partial pressure of oxidizing gas in the pod.

The curtain nozzle 12 in the above-mentioned embodiment is a rectangular parallelepiped and has gas ejection holes formed all over its bottom face. Desirably, the shape, arrangement, number, or the like of the ejection holes is appropriately modified to suit, for example, the flow rate of supplied gas or the gap between the top side of the lid 4 and the top side of the opening portion 10 when the door 6 is in the evacuation posture which will be described later. In this case, it is desirable to adapt the purge nozzles 21 in the same manner by appropriately modifying the shape, arrangement, or the like of the gas ejection openings 21b. The door 6, which substantially closes the opening portion 10, may be structured such that the opening portion 10 is completely closed.

When there is a flow of gas such as purge gas, gas surrounding the flow is sucked into the flow to some degree and lowers the purity of the flowing gas gradually, starting from the periphery of the flow. In view of this phenomenon, in the embodiment described above, the range covered by the nozzle openings 12b which are provided in the curtain nozzle 12 to generate a gas curtain is set wider on the side of the mini-environment 52 than a rectangular area that is formed between the top side of the opening portion 10 and the top side of the lid 4 held by the door 6 in the evacuation posture after the door 6 stops pivoting from the position where the opening portion 10 is closed. Even when curtain gas in which gas from downflows generated in the mini-environment 52 is mixed, curtain gas including the mixed gas is prevented from flowing into the space between the opening portion 10 and the lid 4.

Figure 6:
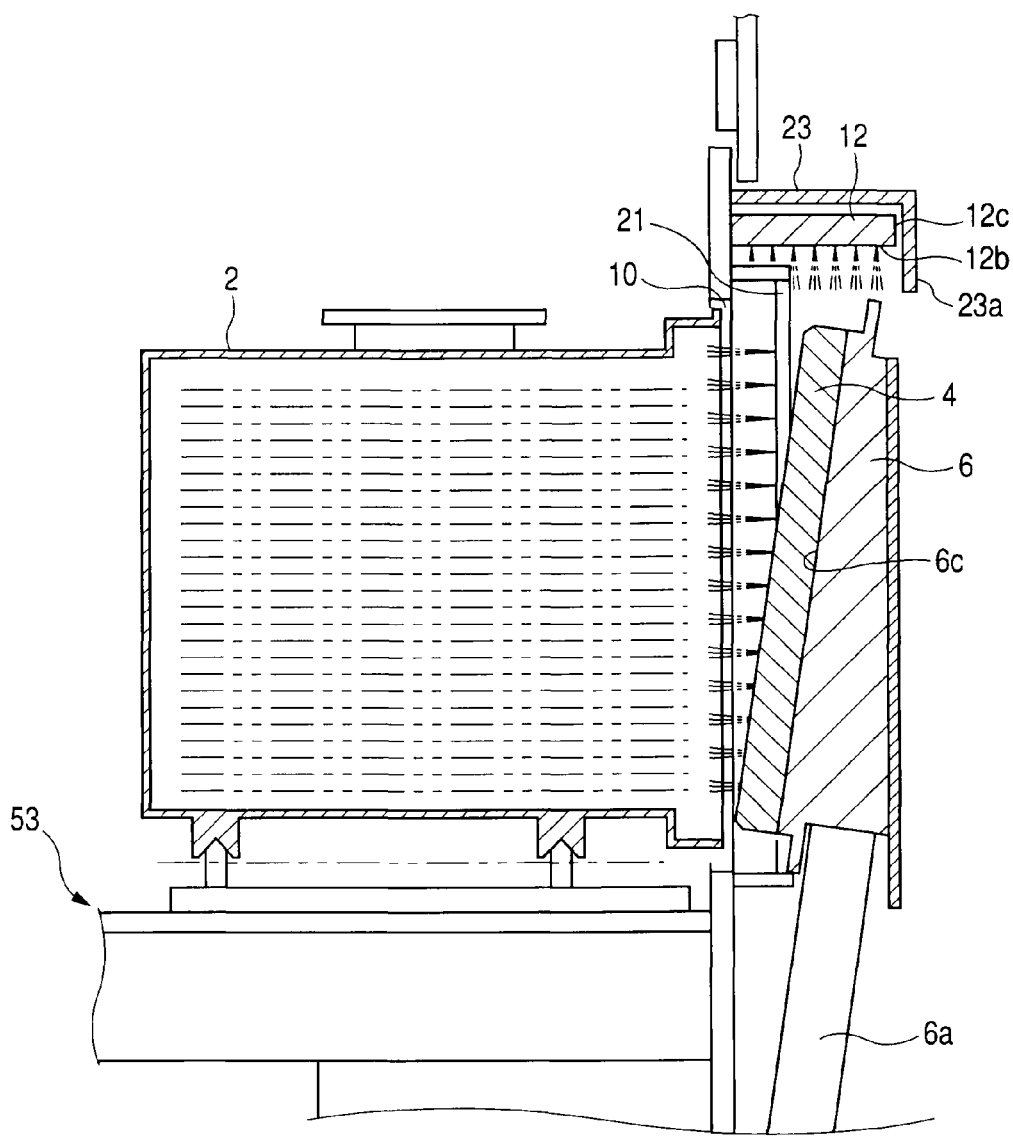
FIG. 6 is a diagram illustrating another mode of the lid opening/closing system according to the present invention.

In supplying purge gas such as inert gas from the purge nozzle or the like, the purge gas ejected from a nozzle hole could suck gas surrounding the hole and the mixed-in gas could lower the purity of the purge gas. The description given below with reference to the drawings is about another structural example for carrying out the present invention in which a measure against sucking gas surrounding a nozzle hole is taken. FIG. 6 is a side view of this structural example illustrating an important part enlarged in the same manner as in FIG. 2A. In FIG. 6, components that present the same effects as those of the components illustrated in FIGS. 2A and 2B will be denoted by the same reference numerals, and descriptions on such components will be omitted here.

In this embodiment, a curtain cover 23 further covers a space above the top face of the curtain nozzle 12 and extends to the mini-environment side past an end face 12c, which faces the mini-environment 52. The curtain cover 23 is shaped like the letter L in section to cover the rectangular parallelepiped shape of the curtain nozzle 12. A vertical face 23a of the curtain cover 23 which is opposite from the end face 12c of the curtain nozzle 12 is extended until the vertical face 23a is substantially flush in the vertical direction with the topmost side of the door 6 in the evacuation posture. The curtain cover 23 eliminates the constant supply of surrounding gas (gas supplied from downflows in which only particles are managed) to the vicinity of the nozzle. Also, the vertical face 23a extended downward prevents the downflows from being pulled into the gas curtain. The purity of the curtain gas from the curtain nozzle 12 to the lid 4 can thus be maintained at an even higher level than in the structure of the above-mentioned embodiment.

Figure 7:
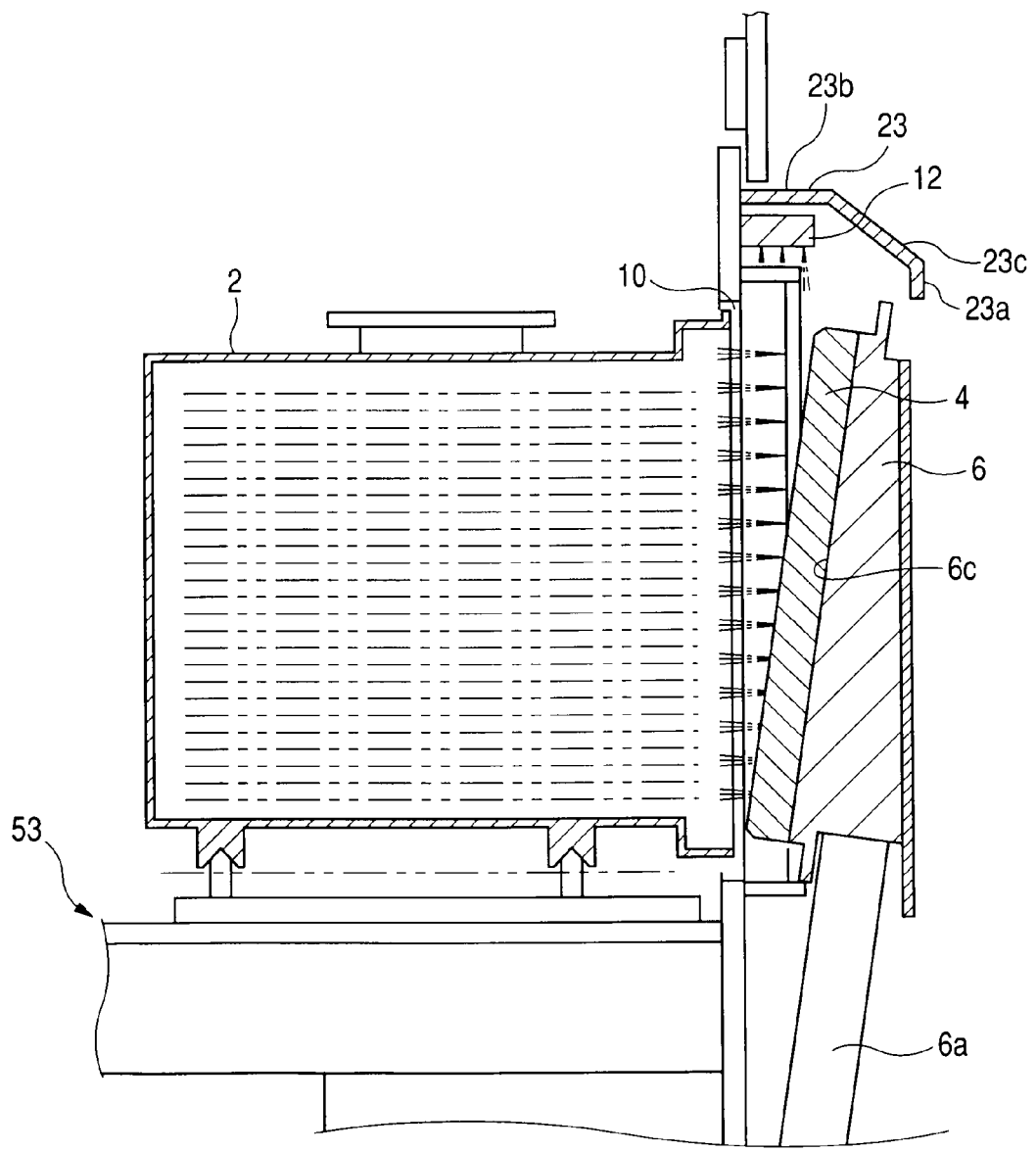
FIG. 7 is a diagram illustrating still another mode of the lid opening/closing system according to the present invention.

FIG. 7 illustrates a modification example of the mode of FIG. 6 in the same manner as in FIG. 6. Similarly to the mode of FIG. 6, components in FIG. 7 that present the same effects as those of the already described components are denoted by the same reference numerals, and descriptions on such components will be omitted here. In this mode, the sides of the curtain nozzle 12 that run along the driving direction of the pod 2 are given a shorter length, and hence the range covered by the nozzle openings 12b is smaller than the rectangular area that is formed between the top side of the opening portion 10 and the top side of the lid 4 held by the door 6 in the evacuation posture. This structure makes the gas curtain thinner, which means that the current velocity of the curtain gas can be raised without increasing, to a great degree the flow rate of the purge gas that is used for the curtain gas, and that the curtain gas can be supplied to the back of the pod 2. For example, the interior of the pod can be purged at a low flow rate by sending gas that is supplied from the purge nozzle to a region relatively nearer to the opening side in the pod 2 while sending the curtain gas to a region at the back of the pod 2.

In this case, the need to prevent atmosphere surrounding a nozzle opening from being sucked in and to prevent the curtain gas flow from pulling in surrounding gas is greater than in the structure described above. The curtain cover 23 therefore needs to effectively cover a space from the curtain nozzle 12 to the rectangular area that is formed between the top side of the opening portion 10 (a mini-environment side face of the wall 11) and the top side of the lid 4 held by the door 6. In this mode, the width (the length from a side that is joined to the wall 11 to its opposite side) of a horizontal face 23b of the curtain cover 23 is set substantially equal to the corresponding width of the curtain nozzle 12. The horizontal face 23b is joined to the vertical face 23a through an inclined face 23c, which is provided to make the space smaller. The vertical face 23a is extended downward on the mini-environment side past the topmost side of the door 6. Shaping the curtain cover 23 in this manner avoids pulling in atmospheric air from downflows in the mini-environment even in the case of the reduced size of the curtain nozzle 12.

The above-mentioned curtain nozzle 12 and curtain cover 23 are both placed between the above-mentioned rectangular area including the wall 11 and the lid 4 as two opposing sides and the fan filter unit in the direction of the downflows generated in the mini-environment. The curtain nozzle 12 and the curtain cover 23 act as an influx preventing member, which reduces or prevents the atmospheric air supplied from the fan filter unit to the interior of the mini-environment from reaching the rectangular area due to the downflows. To attain this object with the influx preventing member that is constituted of the curtain nozzle alone, it is necessary to secure the effect in which the curtain nozzle covers the rectangular area by giving the curtain nozzle a larger shape than that of the rectangular area. In this case, the range covered by the nozzle openings is desirably set larger than the rectangular area as in the above-mentioned mode. In the case where the curtain nozzle has a smaller shape than that of the rectangular area, it is desirable that the curtain cover is provided to cover the rectangular area. The curtain cover desirably has the above-mentioned vertical face to have an effect of regulating the downflows from the fan filter unit and the flow of the gas curtain both.

EMBODIMENT

Figure 8:
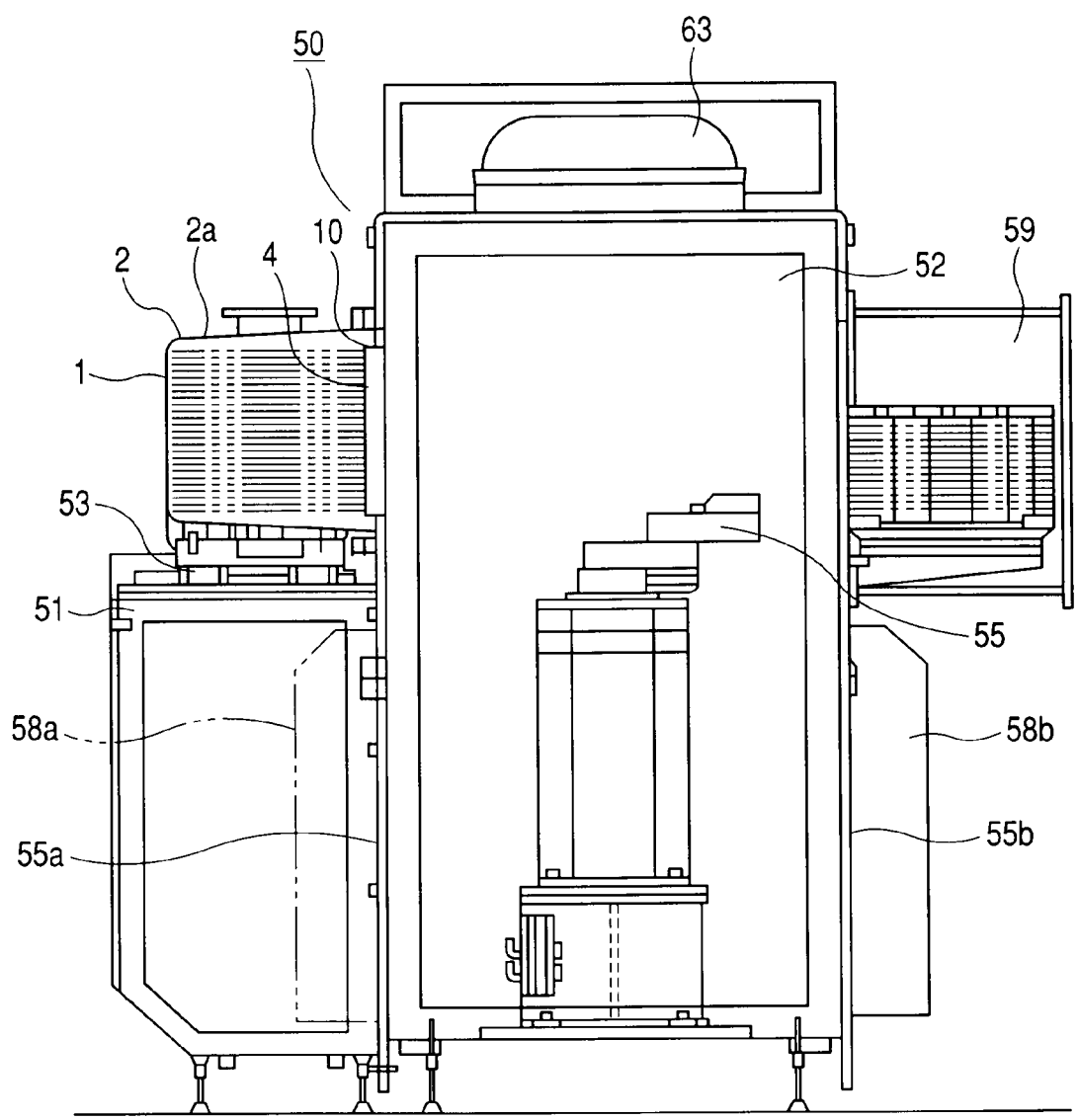
FIG. 8 is an overall side view illustrating the schematic structure of a common semiconductor wafer processing apparatus to which the present invention is applied.

Next, a FIMS system as an actual lid opening/closing system which implements the present invention and semiconductor wafer processing apparatus using the system are described. FIG. 8 illustrates a schematic structure of a semiconductor wafer processing apparatus 50 which conforms to a so-called mini-environment system. The semiconductor wafer processing apparatus 50 is mainly formed of a load port portion (FIMS system, lid opening/closing device) 51, the transfer chamber (mini-environment) 52, and a processing chamber 59. A partition 55a and a cover 58a on the side of the load port and a partition 55b and a cover 58b on the side of the processing chamber are provided between the load port portion 51 and the transfer chamber 52 and between the transfer chamber 52 and the processing chamber 59, respectively. In order to remove contaminants and maintain high purity in the transfer chamber 52 of the semiconductor wafer processing apparatus 50, a fan filter unit 63 provided above the transfer chamber 52 generates airflow (down flow) from a top portion of the transfer chamber 52 to a lower portion of the transfer chamber 52. Further, a downflow drainage passageway is positioned on the lower surface of the transfer chamber 52. From this construction, this always emits contaminants downward.

The pod 2 which is a storage container for storing silicon wafers or the like (hereinafter merely referred to "wafers") is mounted on the mount base 53. As described earlier, the inside of the transfer chamber 52 is maintained to high cleanliness in order to process the wafers 1. Further, the transfer chamber 52 includes a robot arm 55 which actually can hold the wafers by the transfer mechanism. The wafers are transferred between the pod 2 and the processing chamber 59 due to the robot arm 55. The processing chamber 59 normally includes various mechanisms for performing processings, such as thin film formation and thin film processing on the surfaces of the wafers. However, the mechanisms are not directly related to the present invention, and hence the description will be omitted.

As described above, the pod 2 has a space for storing the wafers 1, each of which is the object to be processed, in the inside thereof. The pod 2 includes the box main body portion 2a having the opening provided in one of the surfaces and the lid 4 for enclosing the opening. The main body 2a includes the rack having the plurality of shelves for stacking the wafers 1 in one direction. Each of the wafers 1 placed on the shelves are stored in the inside of the pod 2 at predetermined intervals. In this embodiment, the direction in which the wafers 1 are stacked is set to the vertical direction. The opening portion 10 and the above-mentioned inflow preventing member are provided on the load port portion 51 side of the transfer chamber 52. When the pod 2 is to be located on the load port portion 51 such that the pod 2 is close to the opening portion 10, the opening portion 10 is located opposite to the opening portion of the pod 2. Descriptions and illustrations of the main components according to the present invention, such as the curtain nozzle 12 and the door 6, will be omitted here since they are already given in the above embodiment, and for the purpose of making the drawings easier to understand.

Figure 9A:
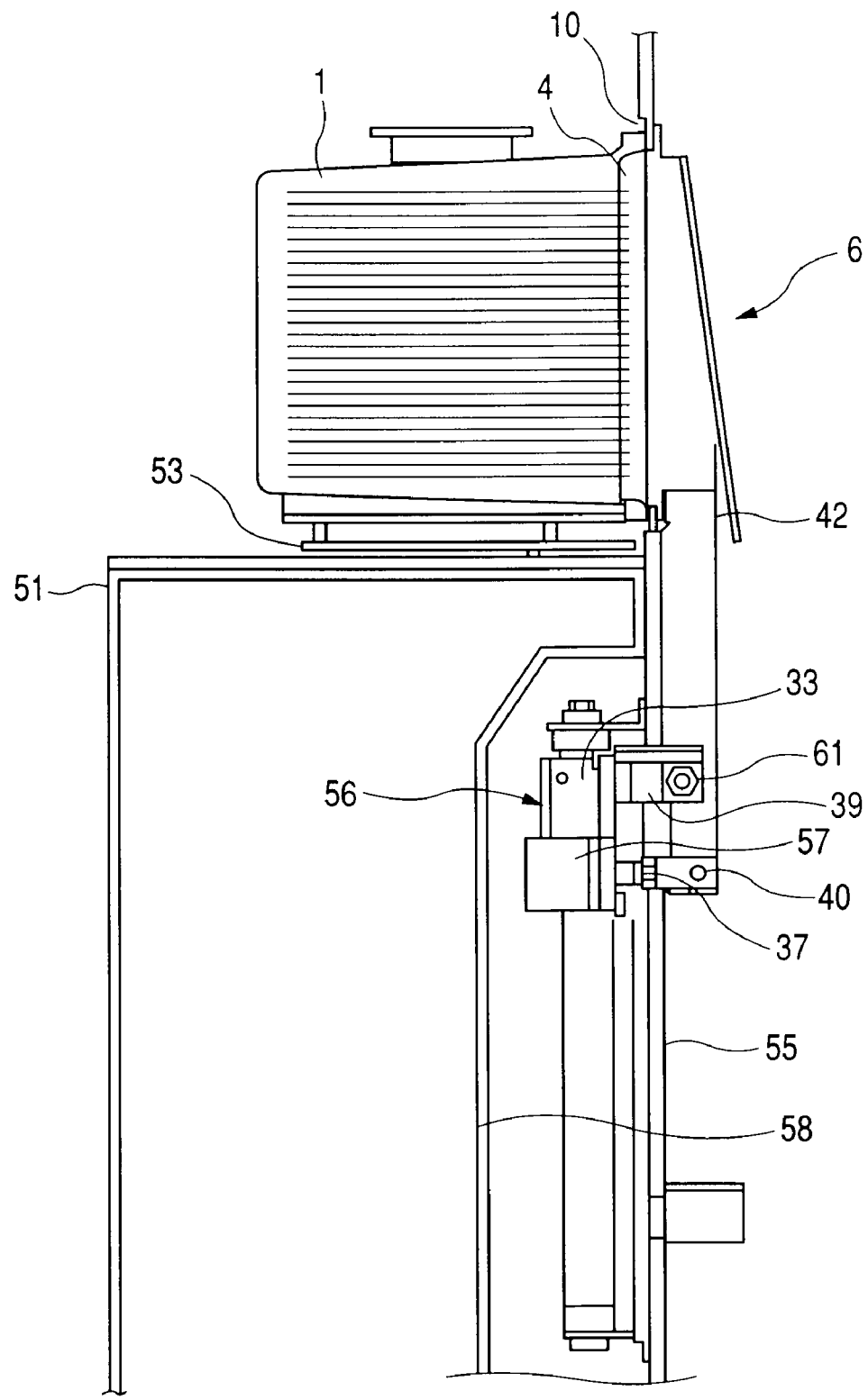
FIG. 9A is an enlarged side view of the schematic structure of a door opening/closing mechanism and components near the mechanism in the apparatus of FIG. 8.
Figure 9B:
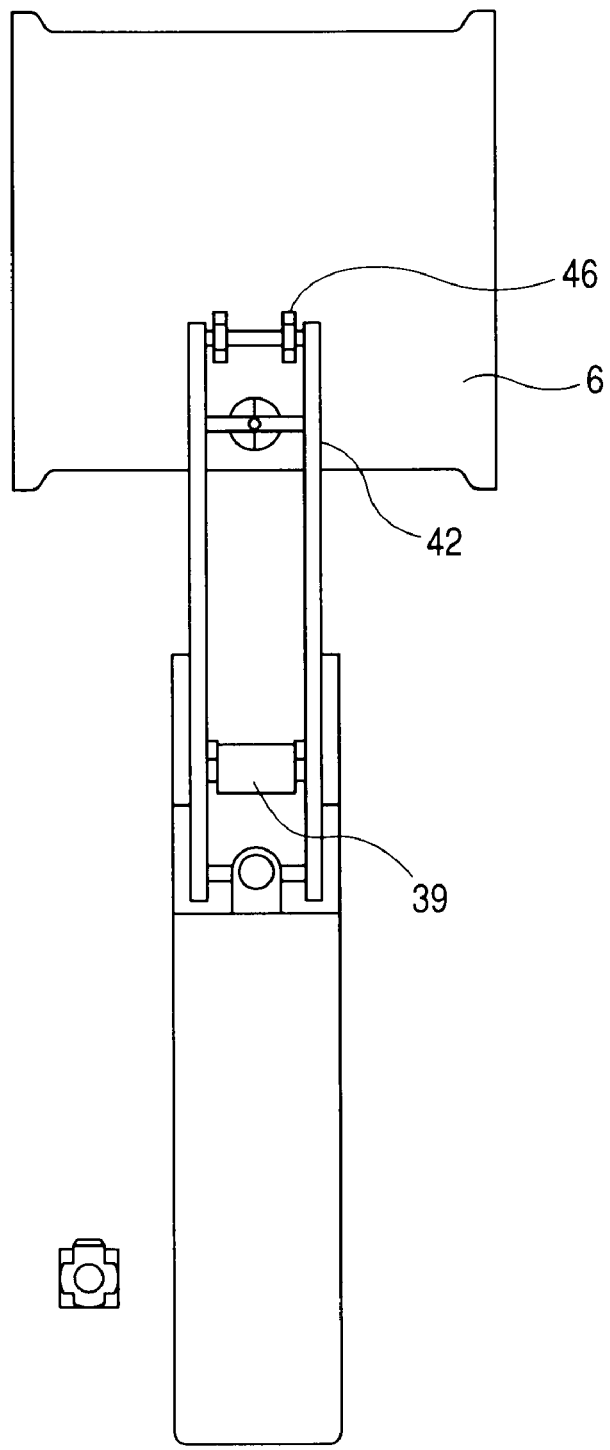
FIG. 9B is a schematic structural diagram of the components of FIG. 9A viewed from a transfer chamber.
Figure 9C:
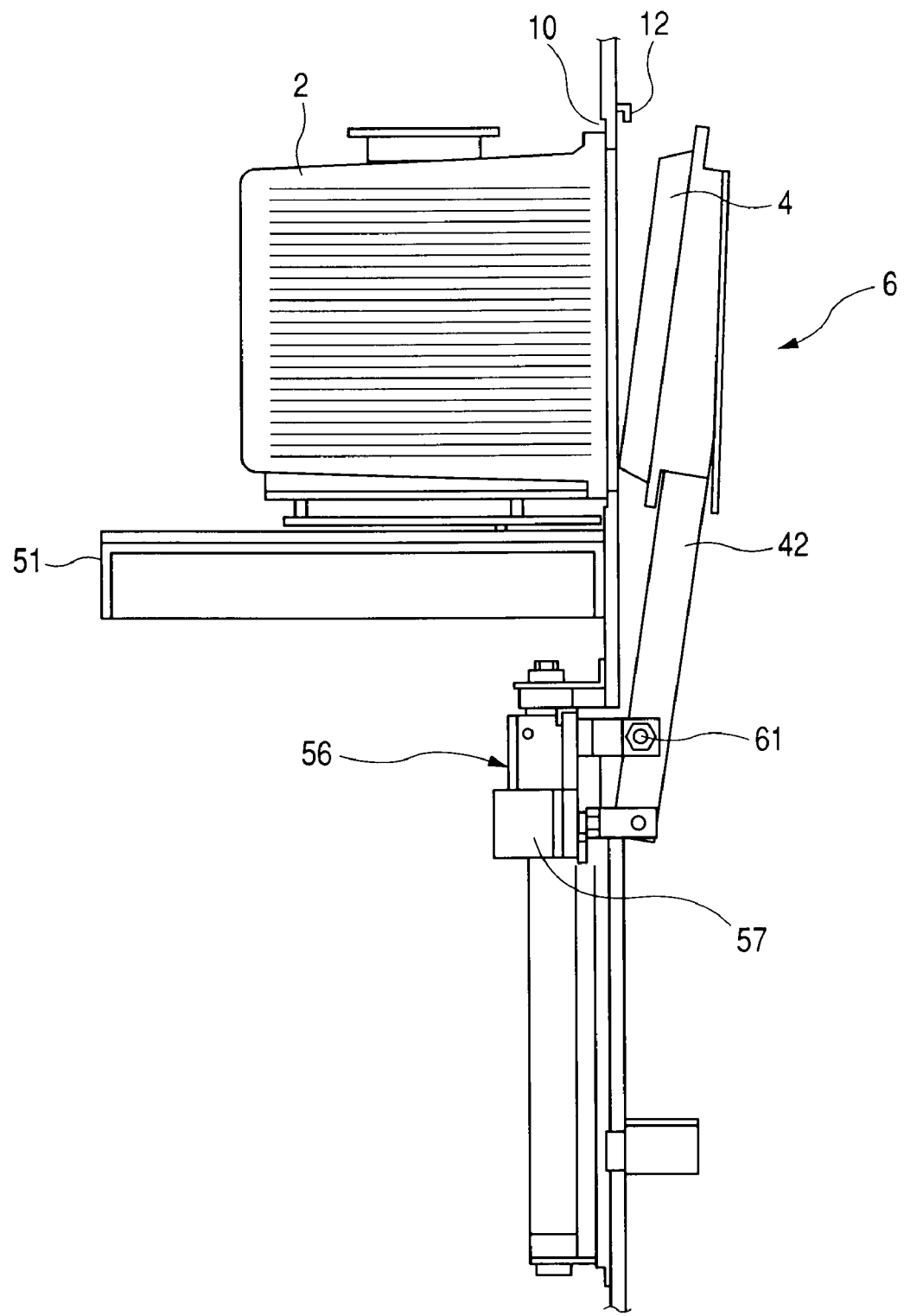
FIG. 9C is a diagram of the components of FIG. 9A with the lid detached from the pod by a door which is an enlarged side view as in FIG. 9A.

FIG. 9A is an enlarged side cross sectional view illustrating the door 6 and the door opening/closing mechanism 60 in a conventional apparatus and FIG. 9B is a frontal view illustrating the door 6 and the door opening/closing mechanism 60 which are viewed from the transfer chamber 52 side. FIG. 9C is a schematic side cross sectional view illustrating a state where the lid 4 is removed from the pod 2 using the door opening/closing mechanism 60. The door 6 is bonded to a fixed member 46. The door 6 is connected to one end of the door arm 6a through the fixed member 46 to be pivotable about the one end of the door arm 42. The door arm 6a is supported at another end thereof to a tip end portion of a rod 37 which is a part of air-drive cylinder 57 through a pivot 40 to be pivotable about the pivot 40.

A through hole is provided between the one end of the door arm 42 and the other end of the door arm 42. A pin (not shown) extends through the through hole and a hole of a fixed member 39 fixed to a support member 60 of a movable portion 56 for moving the configuration up and down, for opening and closing the door of the door arm 42, thereby forming a supporting point 61. Therefore, the door arm 42 is pivotable about the supporting point 61 according to the extension and retraction of the rod 37 due to the drive of the cylinder 57. The support point 61 of the door arm 42 is fixed to the support member 60 to which the vertically movable portion 56 is provided.

When the wafer 1 is processed by the above-mentioned structure, first, the wafer is located on the mount base 53 so as to be adjacent to the transfer chamber opening portion 10, and the lid 4 is held by the door 6. It should be noted that a mechanism-to-engage (not shown) is provided on a surface of the door 6 while a mechanism-to-be-engaged (not shown) is provided on a surface of the lid 4. By actuating those mechanisms with the surfaces of the lid 4 and of the door 6 in contact with each other, the lid 4 is held by the door 6. Here, when the rod of the cylinder 57 is retracted, the door arm 42 moves away from the transfer chamber opening portion 10 with the supporting point 61 being the rotation axis. According to this action, the door 6 rotates together with the lid 4 to remove the lid 4 from the pod 2, as illustrated in FIG. 9C. After that, the movable portion 56 is lowered to move the lid 4 to a predetermined retreat position. The operation of transfer is described in the above-mentioned embodiment, and hence the description thereof will be omitted.

Further, in this embodiment, the description is in the context of FOUP and FIMS, but application of the present invention is not limited thereto. As far as the container is a front-opening type container which contains a plurality of objects to be contained and is opened and closed when the objects to be contained are inserted into or removed from the container in the system, the lid opening/closing device according to the present invention can be applied to maintain the partial pressure of oxidizing atmosphere in the container at a low level. Further, when the gas which fills the container is not inert gas but predetermined gas having desired characteristics, the lid opening/closing system according to the present invention can be used to maintain the partial pressure of the predetermined gas in the container at a high level.

According to the present invention, the interior of the pod can be purged not only with purge gas that is supplied from the purge nozzle as in prior art but also with purge gas that is supplied in the form of a gas curtain from direction different from that of the purge nozzle. The gas curtain prevents the atmospheric air from entering the interior of the pod from the mini-environment side, and, separately from the closing of the atmospheric air, supplies purge gas to wafers. In closing up the pod, the curtain gas is used for the purging in addition to the purge gas from the purge nozzle. The partial pressure of oxidizing gas within the pod is thus effectively prevented from rising. The present invention can be carried out by merely adding the curtain nozzle, the purge nozzle, and the like to an existing FIMS system, and can be installed in a standardized system at low cost with ease.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2007-198622 filed on Jul. 31, 2007, which is hereby incorporated by reference herein.

What is claimed is:

1. A method of processing an object in a container, the container being a storage container which has a substantially box-like main body and a lid, the main body being capable of containing an object inside and having an opening in one face, the lid being detachable from the main body and closing the opening to create an airtight space together with the main body, the object to be contained being put in and taken out of the storage container by detaching the lid from the storage container and thus opening the opening, the object to be contained receiving given processing outside the storage container, the method comprising:
   placing the opening directly opposite from a substantially rectangular opening portion, which is provided in a wall constituting a mini-environment where particles are controlled;
   holding the lid with a door, which substantially closes the opening portion;
   pivoting the door holding the lid by a given angle about a horizontal axis, which is below the opening portion and parallel to the wall, to move the lid into the mini-environment and put the door in an evacuation posture, and driving the door kept in the evacuation posture vertically downward to open the opening portion;
   putting in and taking out the object to be contained through the opening and the opening portion;
   driving the door in the evacuation posture vertically upward to return the door to a stop position where the door has been in after pivoting by the given angle, and then pivoting the door by the given angle in a reverse direction to close the opening with the lid; and
   releasing the lid from the hold of the door,
   wherein a gas curtain can be formed by given gas flowing from a top side to bottom side of the opening portion,
   wherein the method further comprises purging an interior of the storage container by bringing the gas curtain into contact with the lid held by the door while the door is maintaining the evacuation posture after stopping pivoting, thereby redirecting the flow of the given gas forming the gas curtain toward the interior of the storage container, and
   wherein a rectangular area which is formed extending horizontally outward away from the wall between a top side of the opening portion and a top side of the lid when the door is maintained in the evacuation posture is set within an area in the curtain nozzle for forming the gas curtain, in which the nozzle openings are formed.

2. A lid opening/closing system for putting an object to be contained in a storage container and taking the object out of the storage container, the storage container having a substantially box-like main body and a lid, the main body being capable of containing an object inside and having an opening in one face, the lid being detachable from the main body and closing the opening to create an airtight space together with the main body, the object to be contained being put in and taken out of the storage container by detaching the lid from the storage container and thus opening the opening, the system comprising:
- a mount base to which the storage container is mounted;
- a mini-environment which is placed adjacent to the mount base, in which downflows with controlled particles are created through a fan filter unit placed above, and which houses a mechanism for transferring the object to be contained;
- a substantially rectangular opening portion provided in a wall, which is adjacent to the mount base and which defines a part of the mini-environment, and placed directly opposite from the opening in the storage container when the storage container is mounted to the mount base;
- a door which is capable of holding the lid and substantially closing the opening portion, and which opens the opening portion by holding the lid so that the opening and the opening portion communicate with each other;
- purge nozzles placed in the mini-environment and outside two vertical sides of the opening portion to supply given gas into the storage container through the opening portion and the opening; and
- an influx preventing member placed in the mini-environment immediately in front of the opening portion and above a top side of the opening portion, to prevent the downflows from flowing into a space immediately in front of the opening portion,
- wherein the influx preventing member includes a curtain nozzle capable of supplying the given gas in a direction parallel to a direction of the downflows flowing from the top side of the opening portion toward a bottom side of the opening portion,
- wherein, when the opening is to be opened, the door holding the lid pivots by a given angle about a horizontal axis, which is below the opening portion and parallel to the wall, to move the lid into the mini-environment,
- wherein the influx preventing member covers a rectangular area, which is formed extending horizontally outward away from the wall when the door pivots by the given angle and whose opposite two sides are a top side of the lid and the wall, with respect to the flowing direction of the downflows, and the given gas from the curtain nozzle is supplied toward the rectangular area,
- wherein the curtain nozzle has a cubical form and has gas ejection holes formed over a bottom face of the curtain nozzle, and
- wherein the ejection area is set larger than the rectangular area in the mini-environment.

3. The method according to claim 1, wherein a plurality of the objects to be contained are contained in the storage container, and at a time after one of the objects is put in or taken out of the storage container, the door returns to the evacuation posture after stopping pivoting at an upper end of an elevation range of the door and the gas curtain is brought into contact with the lid held by the door to purge the interior of the storage container.

4. The method according to claim 1, wherein the purging the interior of the storage container maintains the evacuation posture after stopping pivoting of the door at an upper end of an elevation range of the door, and is executed at a time of closing the opening of the storage container by the lid.

5. The method according to claim 1, further comprising second purge operation of supplying a purge gas into the interior of the storage container from purge nozzles provided outside vertical sides of the opening portion of the mini-environment and which is stopped when the door is elevated and takes the evacuation posture.

6. A lid opening/closing system for putting an object to be contained in a storage container and taking the object out of the storage container, the storage container having a substantially box-like main body and a lid, the main body being capable of containing an object inside and having an opening in one face, the lid being detachable from the main body and closing the opening to create an airtight space together with the main body, the object to be contained being put in and taken out of the storage container by detaching the lid from the storage container and thus opening the opening, the system comprising:
- a mount base to which the storage container is mounted;
- a mini-environment which is placed adjacent to the mount base, in which downflows with controlled particles are created through a fan filter unit placed above, and which houses a mechanism for transferring the object to be contained;
- a substantially rectangular opening portion provided in a wall, which is adjacent to the mount base and which defines a part of the mini-environment, and placed directly opposite from the opening in the storage container when the storage container is mounted to the mount base;
- a door which is capable of holding the lid and substantially closing the opening portion, and which opens the opening portion by holding the lid so that the opening and the opening portion communicate with each other;
- purge nozzles placed in the mini-environment and outside two vertical sides of the opening portion to supply given gas into the storage container through the opening portion and the opening; and
- an influx preventing member placed in the mini-environment immediately in front of the opening portion and above a top side of the opening portion, to prevent the downflows from flowing into a space immediately in front of the opening portion,
- wherein the influx preventing member includes a curtain nozzle which has a cubical form with gas ejection holes formed over a bottom face of the curtain nozzle and is capable of supplying the given gas in a direction parallel to a direction of the downflows flowing from the top side of the opening portion toward a bottom side of the opening portion, and
- wherein the influx preventing member covers a rectangular area, which is formed extending horizontally outward away from the wall when the door takes an evacuation posture apart from a position for closing the opening portion, with holding the lid and whose opposite two sides are a top side of the lid and the wall, with respect to the flowing direction of the downflows, and the given gas from the bottom surface of the curtain nozzle is supplied toward the rectangular area.

7. A lid opening/closing system according to claim 6, wherein the influx preventing member includes a curtain cover that covers a space above a top face of the curtain nozzle and includes a vertical face opposite an end face of the curtain nozzle at a mini-environment side, and
the curtain nozzle extends from the wall to the vertical face.

* * * * *